United States Patent [19]

Beitman

[11] Patent Number: 4,752,591

[45] Date of Patent: Jun. 21, 1988

[54] SELF-ALIGNED CONTACTS FOR BIPOLAR PROCESS

[75] Inventor: Bruce A. Beitman, Palm Bay, Fla.

[73] Assignee: Harris Corporation, Melbourne, Fla.

[21] Appl. No.: 62,309

[22] Filed: Jun. 15, 1987

[51] Int. Cl.⁴ .......................................... H01L 21/283
[52] U.S. Cl. ........................................ 437/186; 437/31;
  437/187; 437/240; 437/982; 148/DIG. 10;
  148/DIG. 133; 148/DIG. 134; 156/653
[58] Field of Search ................ 437/31, 32, 33, 186,
  437/187, 188, 225, 228, 238, 240, 247, 982;
  357/34, 35, 59; 148/DIG. 10, DIG. 11, DIG.
  51, DIG. 133, DIG. 134; 156/653, 657

[56] References Cited

U.S. PATENT DOCUMENTS

| | | | |
|---|---|---|---|
| 3,925,572 | 12/1975 | Naber | 437/982 |
| 4,157,269 | 6/1979 | Ning et al. | 148/DIG. 124 |
| 4,279,671 | 7/1981 | Kamatsu | 148/DIG. 124 |
| 4,299,862 | 11/1981 | Donley | 437/982 |
| 4,364,165 | 12/1982 | Dickman et al. | 437/48 |
| 4,397,077 | 8/1983 | Derbenwick et al. | 437/48 |
| 4,577,394 | 3/1986 | Peel | 148/DIG. 133 |

FOREIGN PATENT DOCUMENTS 0246640 12/1985 Japan ........................ 148/DIG. 133

Primary Examiner—Brian E. Hearn
Assistant Examiner—Kevin McAndrews
Attorney, Agent, or Firm—William A. Troner; Charles C. Krawczyk

[57] ABSTRACT

A process for manufacturing a bipolar semiconductor device having self-aligned contact regions. The process avoids the need for a masking step for the application of interconnecting contacts by providing a dielectric material having a low melting point over the emitter region of the semiconductor. The dielectric material is heated to its melting point such that it covers and encapsulates the emitter. Conductive contact material is then subsequently provided using the self-alignment feature of the melted dielectric which isolates the base from the contacts.

20 Claims, 4 Drawing Sheets

SELF-ALIGNED CONTACTS FOR BIPOLAR PROCESS

FIELD OF THE INVENTION

The present invention relates generally to semiconductors, and more specifically, to the process of producing semiconductors having self-aligned contacts and the products resulting therefrom.

BACKGROUND OF THE INVENTION

In the present era of very large scale integration, new techniques are needed to more efficiently utilize the space within the semiconductor devices. Certain practical limitations, however, in today's manufacturing process of semiconductors require portions of semiconductor material to be used merely for providing spacing to compensate for such limitations. Such use of semiconductor material occurs in the process of providing interconnecting contacts for the semiconductor devices.

In the manufacture of integrated circuits, interconnecting contacts are provided between the active semiconductive material in which the semiconductor devices are formed, and the interconnect lines. These contacts are typically formed by initially depositing an oxide layer over the top surface of the semiconductor device. A masking layer of photoresist in then provided over the oxide and patterned for exposing the oxide in the contact area. The exposed oxide is then etched, followed by the nonselective deposition of a conducting layer such as aluminum, over the wafer. The conducting layer is then patterned and etched to form the interconnecting contacts.

Inherent in the masking step for patterning the contact area for the base region of a bipolar transistor is the high probability of misaligning the masking layer over the oxide. This misalignment of the masking layer leads to the misalignment of the interconnecting contacts. Addtionally, there exists the potential of overetching the oxide layer during the etching process, which can result in enlarging the size of the contact areas. Either of these occurrences, e.g., the misalignment of the mask or the overetching of the oxide, can short the contacts for the base region with the collector and emitter regions of the semiconductor. To avoid this potential for shorting the base, extra semiconductor material of approximately 2 microns in width is typically provided on each side of the intended location for the contacts such that any potentially misaligned or enlarged contact will be prevented from shorting the collector or emitter regions with the base. This usage of unused active semiconductor area, however, increases the distance of the conductive path from the base contact to the emitter region. This in turn increases the resistance of the base which results in limiting the gain of device unnecessarily. Additionally, the usage of unused active area is a loss of valuable semiconductor real estate which might otherwise be used for additional semiconductor devices.

SUMMARY OF THE INVENTION

It is, therefore, an object of the present invention to provide a new and improved process for producing semiconductor devices.

It is another object of the invention to provide a process for producing semiconductor devices having smaller dimensions.

It is still another object of the present invention to reduce the unused active semiconductor area previously required for the area around the contacts.

It is further an object of the present invention to substantially reduce the possibility of shorting the base region of the semiconductor devices with the collector and emitter regions, by way of eliminating the potential for misalignment or overetching the masking layer previously required for forming the contact area.

It is still further an object of the present invention to eliminate a masking step in the manufacturing of the semiconductor devices, thereby increasing the yield output of the semiconductor product.

It is another object of the present invention to improve the frequency response and gain of the bipolar device.

These and other objects are attained by a process which provides for self-aligning interconnecting contacts. In accordance with a preferred embodiment of the invention, the base region where the contacts are to be formed, is initially covered with a thin dielectric layer leaving the substrate exposed for the emitter region. A layer of conductive material such as a polycrystalline silicon is then deposited on both the dielectric layer and the exposed substrate, followed by a deposition of a second dielectric layer over the conductive layer. The second dielectric layer is chosen such that it has a melting temperature which is lower than the melting temperatures of the other layers. The second dielectric layer is selectively removed over the base region. The now exposed areas of the first conducting layer are selectively removed such that the thin dielectric layer is exposed over the location for the base region. The remaining conductive layer at this point has exposed side surfaces.

The process of selectively removing the dielectric and conducting layers is commonly referred to as patterning and can be performed in a number of known methods. One such method may include the application of a photoresist, exposing selected areas of the photoresist by use of mask, developing the photoresist for exposing selected areas of the underlying material and subsequent etching the exposed underlying material.

The second layer of dielectric material is now heated to a predetermined temperature such that the dielectric material will flow on the exposed side surfaces of the first conductive layer. The melted dielectric will serve to self-align the contacts for the base when a second conductive material is subsequently provided. The exposed thin dielectric layer is selectively removed such that the substrate in the base region is exposed. A conductive material such as a salicide or silicide is deposited or grown over the exposed surface of the substrate, thereby providing the interconnecting contact points to the base region.

In an especially preferred embodiment, the base region is implanted or diffused into the active silicon prior to the heating of the dielectric layer. An additional implant can be performed in the base region immediately under the surface for further reducing the resistance of the base contact. This additional implant may be done either before or after the reflow of the dielectric layer. Additionally, field oxide layers are initially provided by known methods such as by local oxidation for providing isolation between devices.

As a result of the present invention, the unused additional active area required for compensating for potential misalignment or overetching is no longer necessary.

This results in reducing the size of spacing around the contact area significantly, as well as reducing the conductive path between the base contact and emitter. As a result of these reductions in spacing and conduction path, the resistance and parasitic capacitance associated with these parameters is also reduced, thereby improving both the gain and maximum operation frequency of the bipolar device. Additionally, the reduction of spacing around contact area allows for more devices to a be implemented in an equivalent area previously used.

Further objects, features, and advantages of the present invention will become more apparent from the following description when taken with the accompanying drawings which show, for purposes of illustration only, an embodiment in accordance with the present invention.

BRIEF DESCRIPTIONS OF THE DRAWINGS

FIGS. 1-9 are cross-sectional views illustrating a sequence of steps in the fabrication of a semiconductor structure in accordance with a preferred embodiment of the invention.

DETAILED DESCRIPTION OF THE DRAWINGS

FIGS. 1-9 are enlarged cross-sectional views illustrating a sequence of steps used in the fabrication of a semiconductor structure in accordance with a preferred embodiment of the invention.

Figure 1:
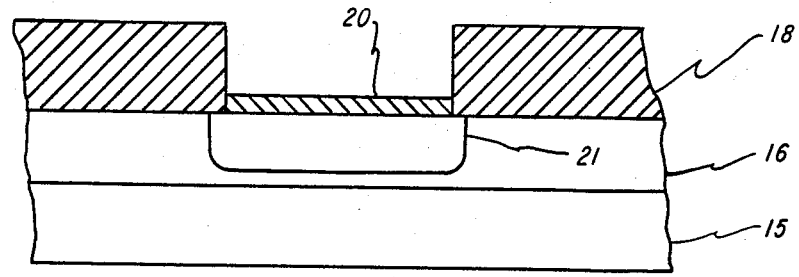

Specifically, FIGS. 1-9 show a bipolar process wherein self-aligned contacts are provided without the standard masking step required in the prior art. FIG. 1 shows a side view of a passivated epitaxial semiconductor wafer. In a particular embodiment, a substrate 15 is provided formed of a monocrystalline silicon wafer. For implementing junction isolated devices, the substrate would be of P-type conductivity as produced by heavy doping with a donor impurity such as gallium. The substrate will include for an N-P-N bipolar device an N-type epitaxial layer 16 of approximately 6 um thick. Field oxide regions 18 shown in FIG. 1 are provided for isolating the respective semiconductor devices, and may comprise thermally grown oxide or oxide provided by vapor deposition. By way of example, a field oxide layer 18 of approximately 10,000 Angstroms thick is deposited uniformly across the top planar surface of the epitaxial layer 16. A masking layer (not shown) of photoresist is applied and patterned such that subsequent etching with a chlorine or fluorine plasma will remove the field oxide layer where the active regions are to be located. A thin oxide layer 20 of approximately 300 to 1000 Angstroms is then grown on the exposed top surface of the epitaxial layer 16 in between in the field oxide regions 18 as shown in FIG. 1.

P-type dopants such as boron are implanted in the epitaxial layer 16 between the field oxide regions 18 to form the base region 21. The wafer may be heated at this point to a temperature of approximately 1000° C. for diffusing the dopants further into the epitaxial layer 16. The extent of the heating, if performed at all, will be dictated by the desired specifications of the device.

Figure 2:
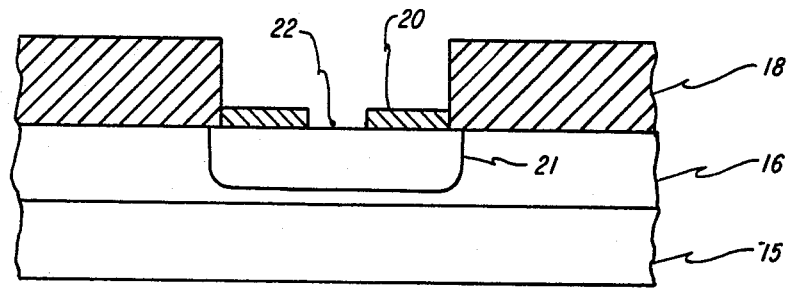

The thin oxide 20 is patterned to form the emitter area as shown in FIG. 2. The surface 22 of the epitaxial layer 16 is exposed in this area. A layer 25 of polycrystalline silicon is then deposited on a top surface of both the thin oxide layer 20 and exposed surface 22 of the epitaxial layer by a low pressure chemical vapor deposition (LPCVD). This layer of polycrystalline silicon is approximately 6000 Angstroms and is doped with an N-type dopant such as phosphorous by implantation oven to develop the emitter region for the bipolar device.

Figure 3:
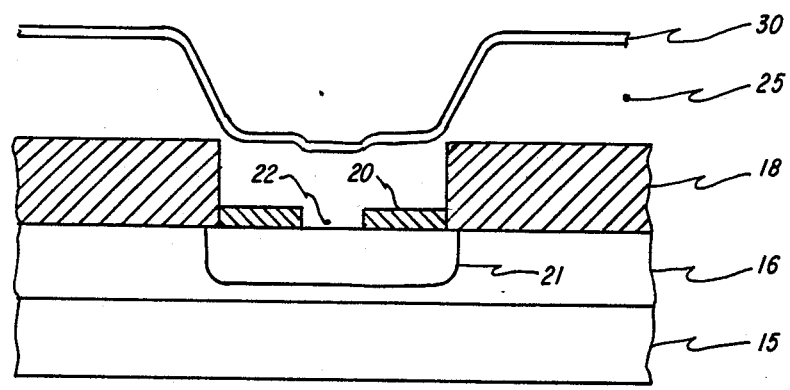
Figure 4:
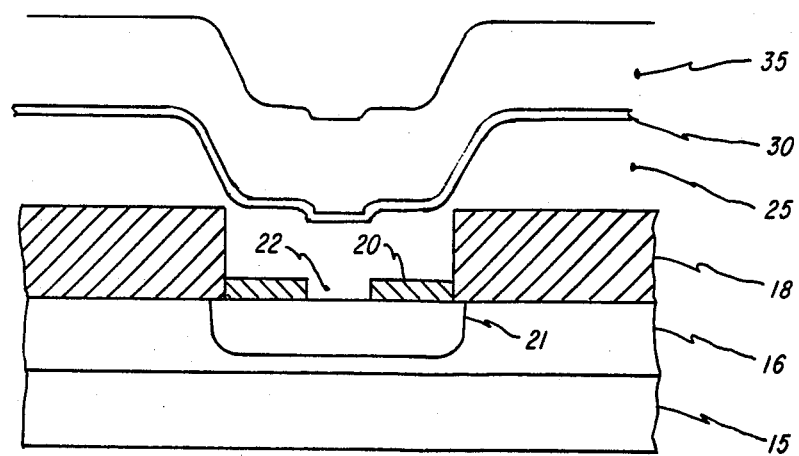

An oxide layer 30 of approximately 500 Angstroms may be grown on the polysilicon layer 25, as shown in FIG. 3. This oxide layer 30 should provide better adhesion of the subsequent dielectric layer 35. A dielectric layer 35 of approximately 6000 Angstroms is deposited on a top surface of the oxide layer 30 as shown in FIG. 4. The dielectric layer 35 is chosen of a composition such that it has a melting temperature which is lower than the melting temperatures of the other layers. A doped silica glass 35 such as Borophosphosilicate glass (BPSG) provides such a material having a melting temperature of approximately 900° C. For purposes of this application, the melting temperature for glass is the temperature at which the glass will begin to flow.

Figure 5:
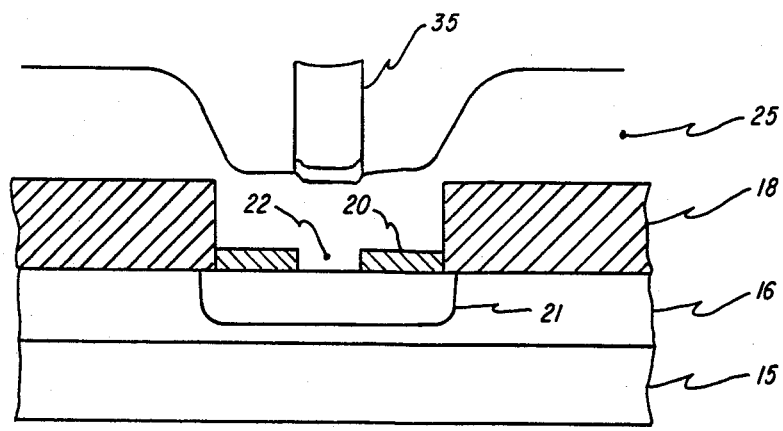
Figure 6:
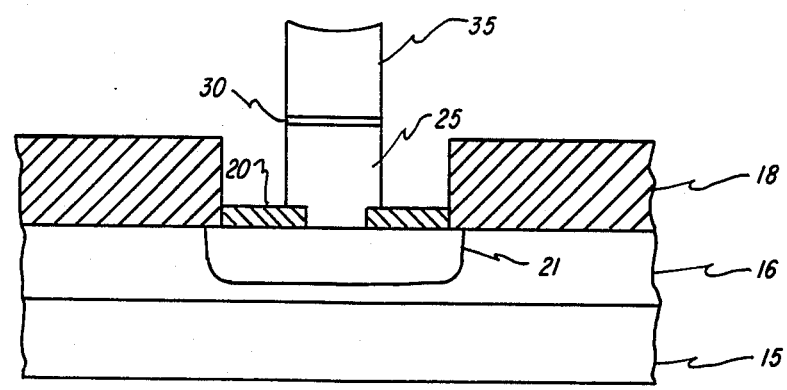

A masking layer of photoresist (not shown) is now applied and patterned on the glass layer 35 such that the glass 35 and oxide 30 layers may be etched away except for the area covering the area to be defined as the emitter as shown in FIG. 5. After the photoresist is removed, the polycrystalline silicon layer 25 is etched by using a plasma etch or reactive ion etch (RIE) using the composite oxide layer 30 and glass layer 35 as a mask as shown in FIG. 6. The field oxide regions 18 and thin oxide 20 act as etch stops for this etching process.

An implant of boron dopants 38 into the base region immediately under the base contact area 38 may be performed at this point. The additional P-type dopants at the contact area will reduce the contact resistance between the base contact and base region. Whether this implant is performed at this point, however, depends upon the lithographic capabilities of the process and electrical specifications of the device. Such lithographic considerations involve the accuracy of the alignment and width of the polycrystalline emitter. If the emitter is made too small or it is aligned too closely to the contact area for the base, the implant of additional P dopants should be deferred in order to avoid potentially shorting the base with the emitter.

Figure 7:
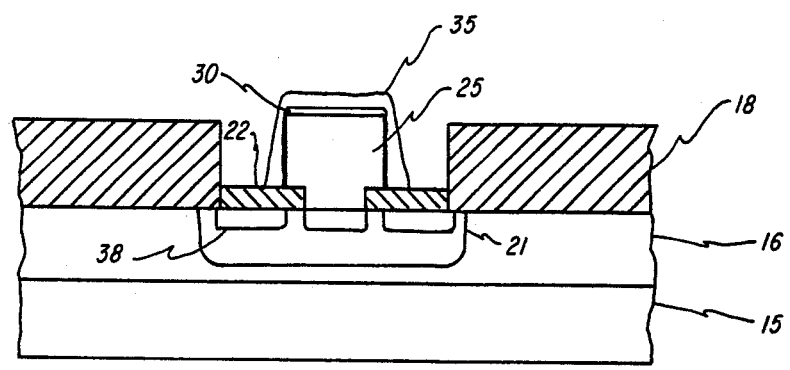

The combined wafer is now heated to a temperature by which the doped glass layer 35 will flow, e.g. for BPSG the flow temperature is approximately 900° C. The heating is continued for approximately one hour or at least until the glass layer flows completely over the exposed surfaces of the polycrystalline silicon layer 30 as seen in FIG. 7.

Once the polycrystalline layer 30 is completely encapsulated, the heating may be discontinued. During this heating process, the desired effect of activating the implanted or diffused dopants for both the base and emitter also occurs.

The implant of additional P-type dopants such as boron immediately under the base contact area 38 may be performed at this point as an alternative to implanting prior to the heating treatment. The advantage of performing the implant after the glass is reflowed is that the glass layer provides additional space between the emitter and where the implanted boron will reside in the epitaxial layer, as well as provides a self-alignment for the implant. Should the implant be performed after the heating step for the reflow, however, an additional heating step will be necessitated for activating this implant. The temperature of this heating step would also be required to be lower than the flowing temperature of the glass to prevent it from flowing again.

Figure 8:
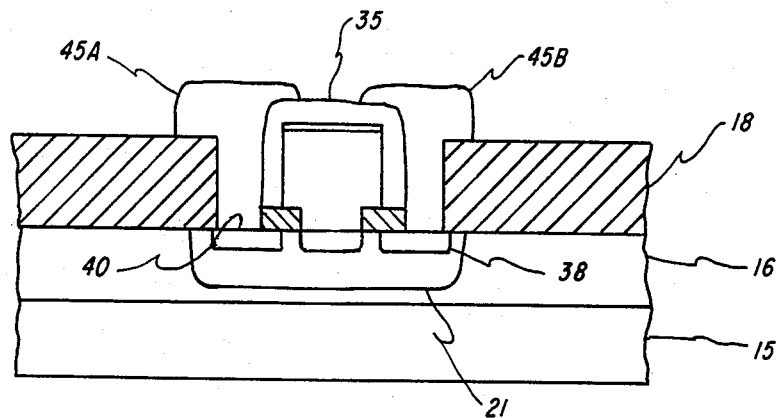

The exposed thin oxide layer 20 is now etched by using a buffered hydroflouric acid for approximately 2 minutes, resulting in exposing the top surface 40 of the epitaxial layer 16 formed on the substrate 15 as seen in FIG. 8. A second conductive layer 45 such as a salicide or a silicide is either deposited or grown by known methods, thereby providing the interconnecting contacts 45(a) and 45(b) to the base region. Alternatively, a metal such as aluminum can be provided in lieu of a salicide or silicide, if preferred. Also, although FIG. 8 shows two contact areas for the base region, only one is necessary for the contact.

Figure 9:
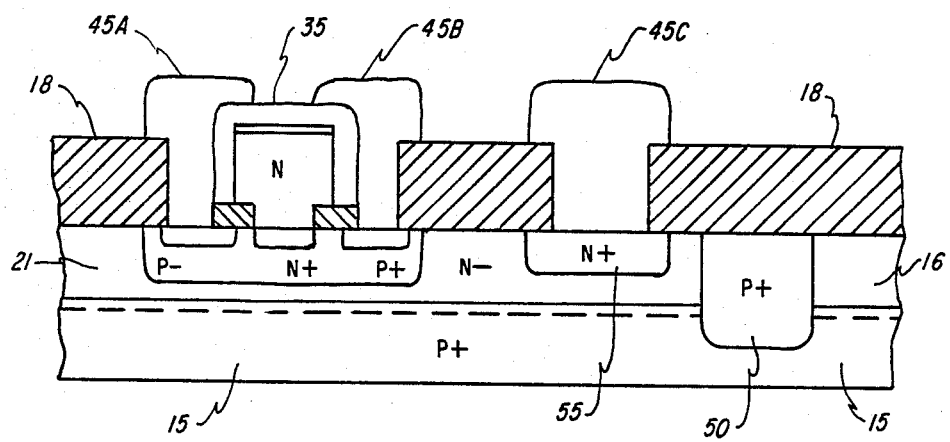

FIG. 9 is an illustration of a preferred embodiment of the next step should junction isolation be preferred. The junction isolation can be implemented using known methods whereby a deep P-type well 50 is formed in the epitaxial layer 16 and extending into the original substrate 15. A collector region 55 is formed in the epitaxial layer 16 using commonly known methods as well. A contact 45 (c) for the collector region is also illustrated in the Figure. Although a junction isolation process is shown, it is noted that the present invention can be implemented in any bipolar process such as in dielectric isolation or silicon on insulation processes. An invention disclosed in a commonly owned patent application and having a Ser. No. 057,398 provides a solution of the unused contact area as it relates to an MOS process.

As can be seen, the areas for the interconnecting contacts for the base are formed in the bipolar device without the need of a separate mask and etching operation as required in the prior art. By using and incorporating a doped glass layer 35 in the process, the glass can be flowed to encapsulate the polysilicon layer 25 such that a mask layer is not needed for the subsequent forming of the base contacts. As a result, there is no potential for misalignment of a mask layer nor the potential of overetching a thick oxide layer to form the contact areas. The added active silicon used to compensate for these potential occurrences is, therefore, no longer necessary resulting in the formation of smaller devices. This will reduce the resistance and parasitic capacitance of the devices, thereby increasing the gain and maximum operating frequency, respectively. Additionally, due to the elimination of a masking step in the manufacture of a semiconductor wafer, the manufacturing yields in the production of the semiconductor devices should improve.

It is noted that although the particular embodiments have been described in which silicon is the semiconductor material, germanium devices may also be constructed in accordance with the invention, as well as III-IV type compound semiconductor devices. It is further noted that although the claimed process refers to providing and removing layers to and from a first surface of the substrate, it is recognized that the process may remove or add to this first surface due to the etchants, oxidation, etc., such that the original first surface may not be the exact subsequent first surface. Nonetheless, the first surface of the substrate will be substantially the same as the following first surface referred to in the process.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed is:

1. A process of manufacturing a semiconductor device comprising:
   (a) providing a substrate having a first surface;
   (b) providing a first dielectric layer over said first surface of said substrate;
   (c) selectively removing a portion of said first dielectric layer and exposing a selected area of said substrate;
   (d) providing a first conductive layer over said first dielectric layer and said exposed substrate;
   (e) providing a second dielectric layer over said first conductive layer;
   (f) patterning said second dielectric layer, and using said dielectric layer as a mask for patterning said first conductive layer;
   (g) patterning said first conductive layer and exposing side surfaces of said first conductive layer;
   (h) heating said second dielectric layer to a predetermined temperature such that said second dielectric layer flows and covers said side surfaces of said first conductive layer;
   (i) removing said first dielectric layer from a contact area; and
   (j) providing a second conductive layer to said contact area.

2. The process of claim 1, wherein said predetermined temperature is lower than a melting temperature of said first dielectric layer and said first conductive layer.

3. The process of claim 2, further comprising providing an epitaxial layer of a first conductivity type on said first surface of said substrate prior to providing said first dielectric layer, said first dielectric layer being provided on a first surface of said epitaxial layer.

4. The process of claim 3, further comprising providing a base region of a second conductivity type in said epitaxial layer prior to providing said first dielectric layer.

5. The process of claim 4, wherein said conductive layer includes a polycrystalline silicon, said process further comprising providing dopants of a first conductivity type in said polycrystalline silicon layer prior to providing said second dielectric layer.

6. The process of claim 5, wherein said second dielectric layer includes a doped silica glass, wherein said heating for flowing said doped silica glass includes heating said glass to approximately 900° C. for a period of time such that said glass flows and covers said side surfaces of said first conductivity layer.

7. The process of claim 6, wherein said epitaxial layer and said substrate include silicon and said second conductive layer includes a salicide, said salicide providing a self-aligned interconnecting contact to said base region.

8. The process of claim 6, wherein said second conductive layer includes a metal, said metal providing a self-aligned interconnecting contact to said base region.

9. The process of claim 6, wherein said substrate includes said first conductivity type and forms a collector region, said process further comprising providing a contact to said substrate.

10. The process of claim 6, further comprising providing dopants of a second conductivity type in said epitaxial layer for forming a collector region.

11. The process of claim 6, further comprising providing an oxide layer on a top surface of said conductive layer before providing said doped silica glass thereon, wherein said composite silica glass and oxide are patterned for exposing said selected areas of said conductive layer thereunder.

12. A process for forming a bipolar semiconductor wafer comprising the steps of:
   (a) providing a substrate of a first conductivity type;
   (b) selectively forming a plurality of field oxide regions on a first surface of said substrate such that an active region is defined between said field oxide regions, wherein said first surface of said substrate is exposed in said active area region;
   (c) providing a base region of a second conductivity type in said substrate within substantially said active region;
   (d) selectively forming a thin oxide layer on a portion of said first surface of said substrate in said active region such that an emitter region is defined between said thin oxide layer, wherein said first surface of said substrate is exposed in said emitter region;
   (e) providing a polycrystalline silicon layer over said thin oxide layer and said exposed first surface of said substrate;
   (f) providing a first dielectric layer over said polycrystalline silicon layer, wherein said dielectric layer flows when heated to a preselected temperature;
   (g) selectively removing said first dielectric layer and exposing selected areas of said polycrystalline silicon layer;
   (h) selectively removing said exposed regions of said polycrystalline layer and exposing selected areas of said thin oxide layer, wherein side surfaces of said polycrystalline layer are exposed as a result of said removal of said exposed regions thereof;
   (i) heating said dielectric layer to said preselected temperature for causing said dielectric layer to flow and cover said exposed side surfaces of said polycrystalline layer;
   (j) selectively removing said exposed thin oxide and exposing said first surface of said substrate; and
   (k) selectively providing a second conductive layer over said exposed portions of said substrate.

13. The process of claim 12, wherein said dielectric layer includes a flowable doped silica glass having a flowable temperature which is lower than a melting temperature of said thin oxide layers and said polycrystalline silicon layer.

14. The process of claim 13, further comprising providing dopants of a second conductivity type in said polycrystalline silicon layer for forming said emitter prior providing said first dielectric layer over said polycrystalline silicon layer.

15. The process of claim 14, wherein said heating said dielectric layer includes heating said doped silica glass to approximately 900° C. wherein said heating causes said doped silica glass to flow over the exposed surfaces of said polycrystalline silicon layer, said heating further causing said dopants in said polycrystalline layer to diffuse into said substrate whereby a shallow emitter region is formed therein.

16. The process of claim 15, further comprising providing a shallow region of said second conductivity type in said substrate immediately under said thin oxide layers after selectively removing said exposed regions of said polycrystalline layer.

17. The process of claim 16, wherein said substrate includes silicon and said second conductive layer includes a silicide, said silicide providing interconnecting contacts to said base region, said shallow regions of said second conductivity type reducing resistance between said contacts and said base region.

18. The process of claim 16, wherein said substrate includes silicon and said second conductive layer includes a salicide, said salicide providing interconnecting contacts to said base region, said shallow regions of said second conductivity type reducing resistance between said contacts and said base region.

19. The process of claim 16, wherein said substrate includes silicon and said second conductive layer includes a metal, said metal providing interconnecting contacts to said base region, said shallow regions of said second conductivity type reducing resistance between said contacts and said base region.

20. The process of claim 16, further comprising providing a second oxide layer on said polycrystalline layer before providing said doped silica glass thereon, wherein said composite silica glass and second oxide layer are patterned and etched for exposing said polycrystalline layer there under.

* * * * *